(12) United States Patent
Lee et al.

(10) Patent No.: US 6,388,500 B1
(45) Date of Patent: May 14, 2002

(54) GAIN CONTROLLER USING SWITCHED CAPACITORS

(75) Inventors: Jin-kuk Lee; Dong-young Chang; You-jin Cha, all of Seoul; Geun-soon Kang, Suwon; Seung-hoon Lee, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/575,994

(22) Filed: May 23, 2000

(30) Foreign Application Priority Data

May 24, 1999 (KR) .............................................. 99-18666

(51) Int. Cl.[7] .................................................. G06G 7/18
(52) U.S. Cl. ........................................ 327/337; 327/554
(58) Field of Search ................................. 327/337, 344, 327/554, 558, 561, 562, 563, 341; 330/254, 252, 253

(56) References Cited

U.S. PATENT DOCUMENTS 5,724,000 A * 3/1998 Quinn .......................... 327/554
5,986,497 A * 11/1999 Tsugai ......................... 327/554
6,147,551 A * 11/2000 Hong .......................... 327/554

* cited by examiner

Primary Examiner—Terry D. Cunningham
Assistant Examiner—Linh Nguyen
(74) Attorney, Agent, or Firm—Mills & Onello LLP

(57) ABSTRACT

A gain controller using switched capacitors is provided. The gain controller is operable in a sampling mode or an amplifying mode and controls the gain of an analog input signal. The gain controller includes an operational amplifier, input capacitors, a feedback capacitor, and switches. The operational amplifier controls the gain of the analog input signal and generates an output signal having the controlled gain. The input capacitors are connected to the input side of the operational amplifier in parallel. The feedback capacitor is connected between the input side and the output side of the operational amplifier. The switches connect at least one of the input capacitors to the input signal or a reference voltage, in response to the kinds of operation modes and a predetermined externally applied digital gain control signal. According to the gain controller using switched capacitors, it is possible to automatically control the gain of an input signal at high speed and to reduce power consumption since the time required for settling the gain of the input signal to a desired value is short.

4 Claims, 4 Drawing Sheets

GAIN CONTROLLER USING SWITCHED CAPACITORS

BACKGROUND OF THE INVENTION

1. Field of the Invention

The present invention relates to gain controlling circuitry, and more particularly, to a gain controller for digitally controlling the gain of an input signal using switched capacitors.

2. Description of the Related Art

FIG. 1 is a block diagram of a conventional gain controller for controlling the gain of an input signal using switched capacitors. The gain controller of FIG. 1 includes feedback capacitors $C_{F1}$ and $C_{F2}$, an operational amplifier 10, input capacitors $C_{I1}$ and $C_{I2}$, and MOS transistors MN1 through MN7 which operate as switches.

FIG. 2 shows waveforms of first and second control clock signals Q1 and Q2 for controlling the opening and closing of the MOS transistors MN1 through MN7 shown in FIG. 1, which operate as the switches. The clock signals Q1 and Q2 of FIG. 2 are applied to MOS transistors MN1 through MN7 as shown in FIG. 1. Specifically, Q1 is used to control MOS a transistors MN3 through MN7, and Q2 is used to control MN1 and MN2. It is noted that the falling edge of the first control clock signal Q1 does not overlap the rising edge of the second control clock signal Q2. This is to prevent the MOS transistors MN1 and MN2 and the MOS transistors MN3 through MN7 from being simultaneously turned on.

The gain controller shown in FIG. 1 operates in two modes. Namely, the gain controller operates in a sampling mode when the first control clock signal Q1 is at a logic "high" level and operates in an amplifying mode when the second control clock signal Q2 is at the logic "high" level.

Charge amounts $Q_{I1}$ and $Q_{I2}$ charged to the input capacitors $C_{I1}$ and $C_{I2}$, respectively, in the sampling mode are equal to the sums $Q_{f1}$ and $Q_{f2}$ of charge amounts charged to the input capacitors $C_{I1}$ and $C_{I2}$ and the feedback capacitors $C_{F1}$ and $C_{F2}$, respectively, in the amplifying mode. When the capacitance of the input capacitors $C_{I1}$ and $C_{I2}$ is $C_I$ and the capacitance of the feedback capacitors $C_{F1}$ and $C_{F2}$ is $C_F$, the following relationship is established between the difference $V_{INT}-V_{INC}$ between input voltages $V_{INT}$ and $V_{INC}$ and the difference $V_{OUTT}-V_{OUTC}$ between output voltages $V_{OUTT}$ and $V_{OUTC}$.

$$V_{OUTT} - V_{OUTC} = \frac{C_I}{C_F}(V_{INT} - V_{INC}) \tag{1}$$

A feedback factor is $1/\beta$ in the amplifying mode. Here, $\beta$ is a feedback gain value, which is represented as follows.

$$\beta = \frac{C_F}{C_I + C_F} \tag{2}$$

As the above-mentioned feedback factor $1/\beta$ increases, the operating speed of the gain controller shown in FIG. 1 is reduced. Therefore, in order to increase the operating speed of the gain controller, the value of $\beta$ defined by Equation 2 must be increased.

It is assumed that the MOS transistors MN1 and MN3 and the input capacitor $C_{I1}$ shown in FIG. 1 constitute a cell. A plurality of cells are connected to the negative input terminal of the operational amplifier 10 in parallel. Also, it is assumed that the MOS transistors MN2 and MN4 and the input capacitor $C_{I2}$ constitute another cell. A plurality of cells are connected to the positive input terminal of the operational amplifier 10 in parallel. In order to select desired cells among the cells connected An parallel, an externally generated digital gain control signal is used. Accordingly, the value of the gain $C_I/C_F$ shown in Equation 1 can be changed.

In the conventional gain controller, the digital gain control signal is used in order to change the value of $C_I/C_F$. Only one cell is selected. The input capacitance of the capacitor included in the selected cell is previously set so as to obtain a desired value of $C_I/C_F$. Namely, when the gain $C_I/C_F$ of the difference $V_{INT}-V_{INC}$ is to be controlled as a $C_I/C_F$ in the conventional gain controller, corresponding two cells, which include the capacitor having the capacitance $a^*C_F'$ ($C_F'$ is the capacitance of $C_F$), are to be selected in response to the digital gain control signal among the plurality of cells connected to the positive and negative input terminals of the operational amplifier 10 in parallel.

For example, it is assumed that the capacitance of the feedback capacitor $C_F$ is set to be $C_O$ and that first through fourth cells are connected to the negative input terminal of the operational amplifier 10 in parallel. Also, it is assumed that fifth through eighth cells are connected to the positive input terminal of the operational amplifier 10 in parallel and that the capacitor included in the first cell and the capacitor included in the fifth cell have the capacitance $C_O$. Also, it is assumed that the capacitor included in the second cell and the capacitor included in the sixth cell have capacitance $2C_O$ and that the capacitor included in the third cell and the capacitor included in the seventh cell have capacitance $4C_O$. Also, it is assumed that the capacitor included in the fourth cell and the capacitor included in the eighth cell have capacitance $8C_O$ and that the gain of the difference is controlled by the digital gain control signal of two bits. In the conventional gain controller, in order to control the gain of the difference to be '1', a digital gain control signal '00' is received and the capacitors included in the first and fifth cells are selected. Also, in the conventional gain controller, in order to control the gain of the difference to be '2', a digital gain control signal '01' is received and the capacitors included in the second and sixth cell are selected. In the conventional gain controller, in order to control the gain to be '4', a digital gain control signal '10' is received and the capacitors included in the third and seventh cells are selected. Also, in the conventional gain controller, in order to control the gain to be '8', a digital gain control signal '11' is received and the capacitors included in the fourth and eighth cells are selected. In this case, the feedback gain $\beta$ of the gain controller shown in FIG. 1 becomes 1/16. This is because $C_F$ is $C_O$ and $C_I$ is $15C_O$ in Equation 2. Also, in this case, the feedback factor is '16'.

FIG. 3 is a bode plot for describing the operation of the gain controller shown in FIG. 1. The horizontal axis denotes frequency and the vertical axis denotes open loop gain represented by dB. The operational amplifier 10 shown in FIG. 1 has the frequency characteristic 20 as shown in FIG. 3. The operation frequency of the gain controller shown in FIG.1 is $f_{-3dB}$, which is a point where the feedback factor $1/\beta$ (illustrated by reference numeral 22) of the gain controller shown in FIG. 1 crosses the frequency characteristic 20 of the gain controller. Here, the operation frequency $f_{-3dB}$ increases as the feedback factor $1/\beta$ decreases. Also, as the operation frequency $f_{-3dB}$ increases, the operating speed of the gain controller increases. However, in the conventional gain controller shown in FIG. 1, the feedback factor is '16'. Accordingly, the operating speed is not as fast.

In particular, when the gain must be controlled to be precise over a wide range, only two corresponding cells must be selected and the capacitances of the capacitors included in the selected cells must be increased. Therefore, the entire sampling capacitance, for example, $C_O+2C_O+4C_O+8C_O$ increases. Accordingly, the feedback gain is exponentially reduced. As the feedback gain is exponentially reduced, the feedback factor increases. The operating speed is significantly reduced as the feedback factor increases as shown in FIG. 3.

SUMMARY OF THE INVENTION

It is an object of the present invention to provide a gain controller using switched capacitors, capable of very quickly controlling the gain of an input signal with low power consumption.

To achieve the above object, there is provided a gain controller which is operable in a sampling mode or an amplifying mode and which controls the gain of an analog input signal. The gain controller of the invention includes an operational amplifier, input capacitors, a feedback capacitor and a plurality of switches. The operational amplifier controls the gain of the analog input signal and generates an output signal having the controlled gain. The input capacitors are connected in parallel to the input side of the operational amplifier. The feedback capacitor is connected between the input side and the output side of the operational amplifier. The switches connect at least one of the input capacitors to the input signal or a reference voltage, in response to the kinds of operation modes and an externally applied predetermined digital gain control signal.

In one embodiment, each of the switches comprises at least one transistor.

In one embodiment, the gain of the operational amplifier is expressed as a ratio of an input capacitance to the capacitance of the feedback capacitor. The input capacitance is the sum of the capacitances of the input capacitors that are connected to the input signal.

In one embodiment, the digital gain control signal is generated so that the desired input capacitance is determined by the combination of the capacitances of corresponding capacitors among the input capacitors.

The gain controller can be included in a charge-coupled interface system of an image processing system. The interface system can include a charge-coupled device for generating image data, i.e., photographing an image. A correlated double sampler (CDS) samples and holds the photographed image and outputs the sampled and held image. The system also includes an analog-to-digital converter. The gain controller differentially inputs the output of the CDS and controls the gain of the output of the CDS in response to the digital gain control signal. The digital gain control signal is a digital signal processed result corresponding to the level of a digital signal. The analog-to-digital converter converts an analog input signal whose gain is controlled by the gain controller into the digital signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 4:
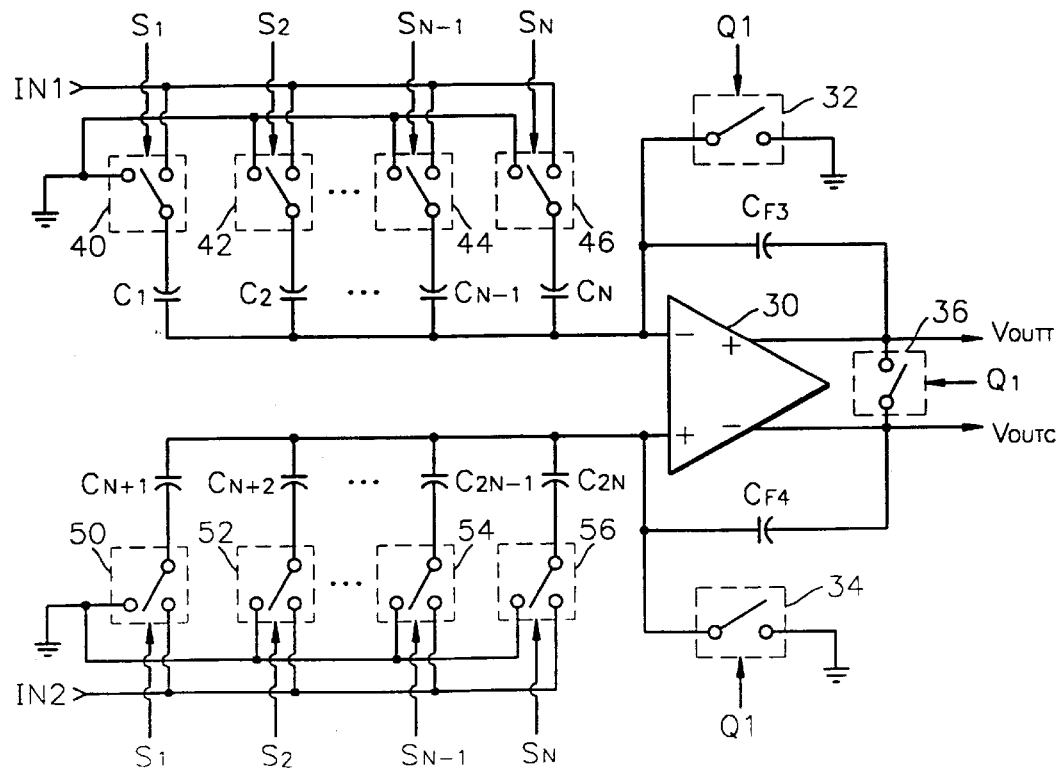
FIG. 4 is a schematic circuit diagram of one embodiment of a gain controller using switched capacitors according to the present invention.

FIG. 4 is a circuit diagram of one embodiment of the gain controller using switched capacitors according to the present invention. The gain controller includes an operational amplifier 30, first through Nth switches 40, 42, . . . , 44 and 46, (N+1)th through 2Nth switches 50, 52, . . . , 54 and 56, first through Nth capacitors $C_1$ through $C_N$, (N+1)th through 2Nth capacitors $C_{N+1}$ through $C_{2N}$, first and second feedback capacitors $C_{F3}$ and $C_{F4}$, and (2N+1)th, (2N+2)th, and (2N+3)th switches 32, 34, and 36.

Referring to FIG. 4, a differential-type or single-type analog signal whose gain is to be controlled is input through a first input terminal IN1 and a second input terminal IN2. Here, the differential-type means that a voltage of +3 volts, for example, is input through the first input terminal IN1 and that a voltage of −3 volts is input through the second input terminal IN2. Here, the single-type means that the voltage of 3 volts is input through the first input terminal IN1 and a reference voltage of 0 volts is input through the second input terminal IN2.

Figure 3:
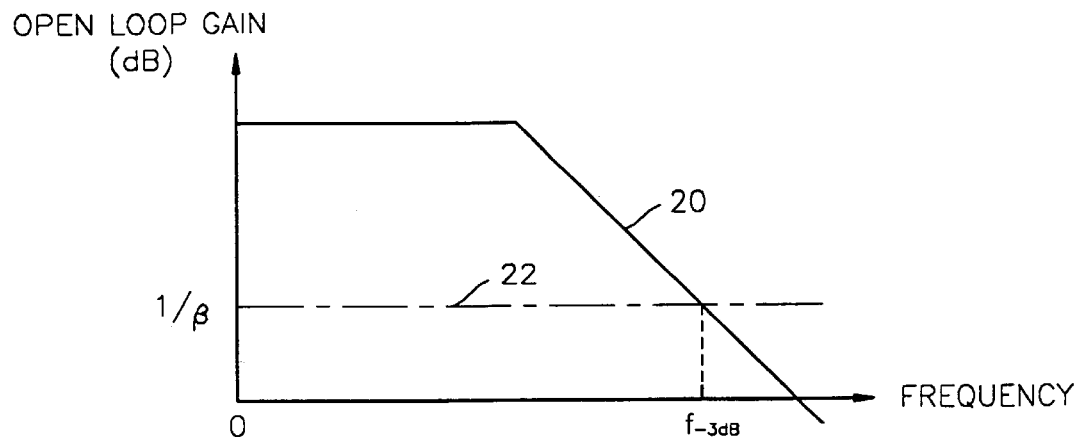
FIG. 3 is a bode plot for describing the operation of the gain controller shown in FIG. 1.

The operational amplifier 30 has the frequency characteristic 20 shown in FIG. 3 and includes a first output terminal $V_{OUTT}$ and a second output terminal $V_{OUTC}$ from which the input signal whose gain is controlled is output. One side of each of the first through Nth capacitors $C_1$ through $C_N$ is connected to the negative input terminal of the operational amplifier 30. One side of each of the (N+1)th through 2Nth capacitors $C_{N+1}$ through $C_{2N}$ is connected to the positive input terminal of the operational amplifier 30. Also, the first through Nth switches 40, 42, . . . , 44, and 46 selectively connect the other side of each of the first through Nth capacitors $C_1$ through $C_N$, respectively, to the first input terminal IN1 or a ground voltage in response to first through Nth selection signals $S_1$ through $S_N$, respectively. Here, each of the switches 40 through 46 can be realized by at least one transistor. The (N+1)th through 2Nth switches 50, 52, . . . , 54, and 56 selectively connect the other side of each of the (N+1)th through 2Nth capacitors $C_{N+1}$ through $C_{2N}$, respectively, to the second input terminal IN2 or the ground voltage in response to the first through Nth selection signals $S_1$ through $S_N$, respectively.

For example, the first switch 40 connects the other side of the first capacitor C1 to the ground voltage or the first input terminal IN1 in response to the first selection signal $S_1$. The (N+1)th switch 50 connects the other side of the (N+1)th capacitor $C_{N+1}$ to the ground voltage or the second input terminal IN2 in response to the first selection signal $S_1$.

The first feedback capacitor $C_{F3}$ is connected between the first output terminal $V_{OUTT}$ of the operational amplifier 30 and the negative input terminal of the operational amplifier 30. The second feedback capacitor $C_{F4}$ is connected between the second output terminal $V_{OUTC}$ of the operational amplifier 30 and the positive input terminal of the operational amplifier 30. The (2N+1)th and (2N+2)th switches 32 and 34 connect the negative and positive input terminals, respectively, of the operational amplifier 30 to the reference voltage in a switching mode. Also, the (2N+3)th switch 36 connects the first output terminal $V_{OUTT}$ to the second output terminal $V_{OUTC}$ in the switching mode.

Figure 1:
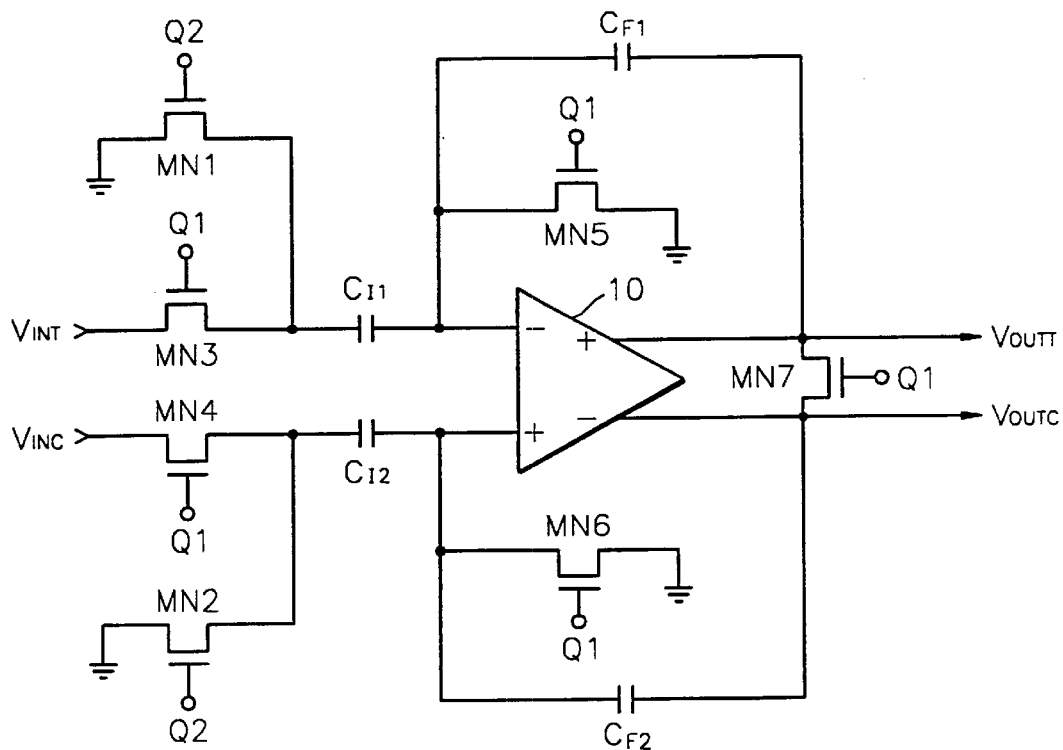
FIG. 1 is a schematic block diagram of a conventional gain controller.
Figure 2:
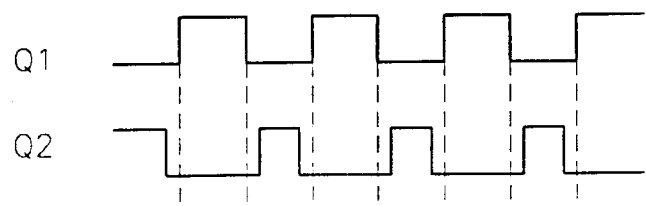
FIG. 2 shows waveforms of first and second control clock signals for controlling the turning on and off of the MOS transistors shown in FIG. 1.

The gain controller according to the present invention, which is shown in FIG. 4, operates in the sampling mode or in the amplifying mode like the conventional gain controller shown in FIG. 1. Therefore, the first through Nth selection signals $S_1$ through $S_N$ are determined according to the operation mode of the gain controller and the digital gain control signal applied from the outside. Namely, the capacitor is connected to the first or second input terminal IN1 or IN2 only when the first control clock signal Q1 shown in FIG. 4 is at a logic "high" level and the digital gain control signal is at the logic "high" level, in the sampling mode. In other cases, the first through Nth selection signals S1 through SN are generated so that the capacitor is connected to the ground voltage. Also, in the amplifying mode, the first through Nth selection signals $S_1$ through $S_N$ are generated so that all the capacitors $C_1$ through $C_{2N}$ are connected to the ground voltage regardless of the digital gain control signal when the second control clock signal Q2 (not shown) is at the logic "high" level. Though not shown in detail, the second control clock signal Q2 is considered to be the same as Q2 shown in FIG. 1, assuming that each of the switches 40 through 46 is realized by at least one transistor. At this time, the first control clock signal Q1 shown in FIG. 3 is generated so that the (2N+1)th through (2N+3)th switches 32, 34, and 36 are turned on in the sampling mode and are turned off in the amplifying mode.

As assumed in the description of the gain controller shown in FIG. 1, it is assumed that the gain controller according to the present invention, which is shown in FIG. 4, controls the gain of an input voltage $V_{IN1}-V_{IN2}$ ($V_{IN1}$ and $V_{IN2}$ denote a voltage input through the first input terminal IN1 and a voltage input through the second input terminal IN2, respectively) to be 1, 2, 4, or, 8. Also, it is assumed that N is 8 and that the capacitances of all the capacitors $C_1$ through $C_{16}$, $C_{F3}$, and $C_{F4}$ are $C_O$. At this time, in the amplifying mode, in the gain controller shown in FIG. 4, only the first and ninth capacitors $C_1$ and $C_9$ are connected to the first and second input terminals IN1 and IN2 in response to the first through eighth selection signals $S_1$ through $S_8$ generated corresponding to the logic combination of a digital gain control signal '00' and the second control clock signal Q2 (not shown) of the logic "high" level, which is shown in FIG. 3, in order to control the gain of the input voltage $V_{IN1}-V_{IN2}$ to be 1. At this time, the remaining capacitors $C_2$ through $C_8$ and $C_{10}$ through $C_{16}$ are connected to the ground voltage. Therefore, an input signal $V_{INT-VINC}$ is sampled only in the first and ninth capacitors C1 and C9 having the capacitance $C_O$. Also, in order to control the gain to be 2, only the first and second capacitors C1 and C2 are connected to the first input terminal IN1 in response to the first through eighth selection signals S1 through S8 generated corresponding to the logic combination of a digital gain control signal '01' and the second control clock signal Q2 of the logic "high" level. At this time, only the ninth and tenth capacitors $C_9$ and $C_{10}$ are connected to the second input terminal IN2 and the remaining capacitors $C_3$ through $C_8$ and $C_{I1}$ through $C_{16}$ are connected to the ground voltage. In order to control the gain to be 4, only the first through fourth capacitors $C_1$ through $C_4$ are connected to the first input terminal IN1 and the ninth through twelfth capacitors $C_9$ through $C_{I2}$ are connected to the second input terminal IN2 in response to the first through eighth selection signals $S_1$ through $S_8$ generated corresponding to the logic combination of a digital gain control signal of '10' and the second control clock signal Q2 of the logic "high" level. At this time, the remaining capacitors $C_5$ through $C_8$ and $C_{13}$ through $C_{16}$ are connected to the ground voltage. Also, in order to control the gain to be 8, the first through eighth capacitors $C_1$ through $C_8$ are connected to the first input terminal IN1 and the ninth through sixteenth capacitors $C_9$ through $C_{16}$ are connected to the second input terminal IN2 in response to the first through eighth selection signals $S_1$ through $S_8$ generated corresponding to the logic combination of a digital gain control signal '11' and the second control clock signal Q2 of the logic "high" level.

In the above-mentioned example, the feedback gain of the gain controller according to the present invention, which is shown in FIG. 4, is 1/9 and the feedback factor is 9. Therefore, the operation frequency $f_{-3d1}$ shown in FIG. 3 becomes larger than the operation frequency of the gain controller shown in FIG. 1. Accordingly, the operating speed of the gain controller according to the present invention, which is shown in FIG. 4, is higher than the operating speed of the conventional gain controller. Also, since the sampling capacitance of the gain controller according to the present invention is 8, which is smaller than the sampling capacitance of the conventional gain controller invention, that is, 16, it is possible to reduce a chip area when the gain controller is realized as a chip. Also, the gain of the input signal can be controlled to have more values using limited capacitors since the capacitors are selectively connected to the input voltage by the digital gain control signal.

When the digital gain control signal is made from four bits, N is 16, and the capacitances of all the capacitors $C_1$ through $C_{32}$, $C_{F3}$, and $C_{F4}$ are $C_O$, the gain of the input signal controlled by the gain controller shown in FIG. 4 can be generalized as shown in Table 1.

TABLE 1

| Gain control signal | Capacitor segment combination logic | |
|---|---|---|
| 0000 | $C_1$ | $\rightarrow a^1 C_O$ |
| 0001 | $C_1 + C_2$ | $\rightarrow a^2 C_O$ |
| . | . | |
| . | . | |
| . | . | |
| 1110 | $C_1 + C_2 + \ldots + C_{15}$ | $\rightarrow a^{15} C_O$ |
| 1111 | $C_1 + C_2 + \ldots + C_{15} + C_{16}$ | $\rightarrow a^{16} C_O$ |

When the gain of the input signal is to be controlled as $a^1$, $a^2, \ldots, a^{15}$, and $a^{16}$, the conventional gain controller shown in FIG. 1 provides capacitors having capacitances $a^1 C_O$, $a^2 C_O, \ldots, a^{15} C_O$, and $a^{16} C_O$ corresponding to the respective gains and selects one among the capacitors. However, in the gain controller according to the present invention, which is shown in FIG. 4, it is possible to obtain a desired gain by combining the capacitors $C_1$ through $C_{2N}$ by the digital gain control signal as shown in Table 1. Therefore, in the present invention, capacitors have capacitances smaller than the capacitances of the capacitors used in the conventional gain controller.

Namely, it is possible to obtain a large gain using a capacitor having a large capacitance in the conventional gain controller. However, it is possible to obtain a large gain by combining capacitors having small capacitances, in the present invention.

Figure 5:
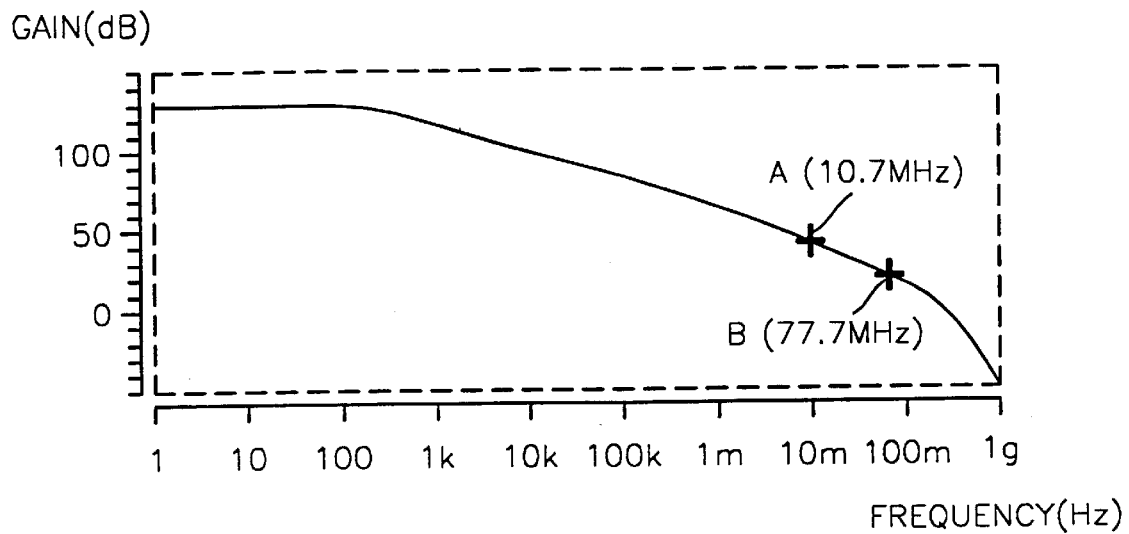
FIG. 5 is a graph for comparing the frequency characteristic of the conventional gain controller with the frequency characteristic of the gain controller according to the present invention.

FIG. 5 is a graph comparing the frequency characteristic of the conventional gain controller with the frequency characteristic of the gain controller according to the present invention. The vertical axis denotes gain in units of dB and the horizontal axis denotes frequency.

Referring to FIG. 5, while the operating frequency $f_{-3dB}$ A of the conventional gain controller is 10.7 MHZ, the operating frequency $f_{-3dB}$ B of the gain controller according to the present invention is 77.7 MHZ, which is about 7 times greater than the conventional operating frequency.

Figure 6:
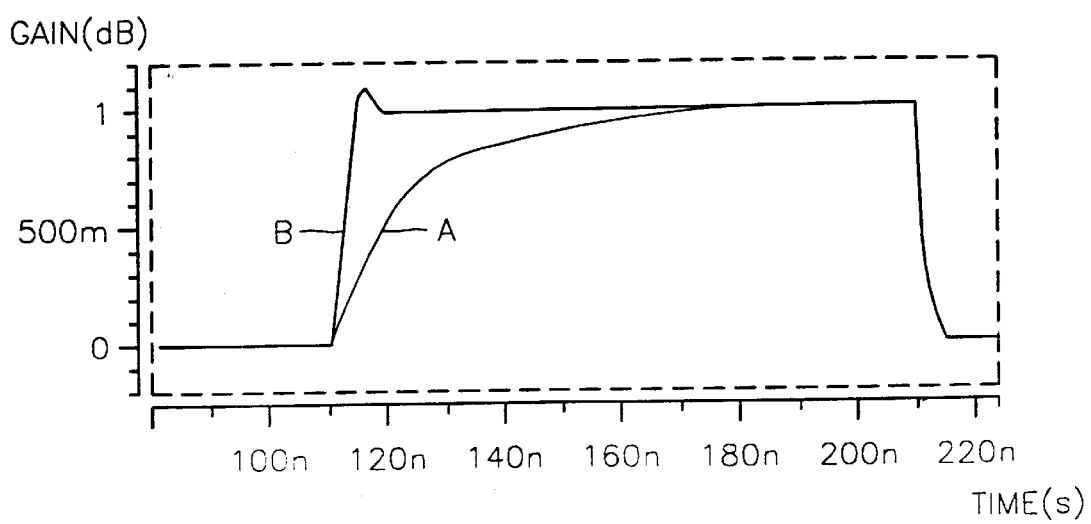
FIG. 6 is a graph for comparing the settling time of the conventional gain controller with the settling time of the gain controller according to the present invention.

FIG. 6 is a graph comparing the settling time of the conventional gain controller with the settling time of the gain controller according to the present invention. The vertical axis denotes the gain in units of dB and the horizontal axis denotes the time.

Referring to FIG. 6, a process A of settling the gain of the input signal to be a desired value '1' very slowly proceeds in the conventional gain controller shown in FIG. 1. While the settling time is very long in the conventional gain controller, a process B of settling the gain of the input signal to be the desired value '1' very rapidly proceeds in the gain controller according to the present invention of FIG. 4. It is noted that the settling time is very short in the gain controller according to the present invention. Therefore, since the settling time is short, the power consumption of the gain controller according to the present invention is less than the power consumption of the conventional gain controller.

The gain controller according to the present invention, which is shown in FIG. 4, can be applied to image processing systems in which a small area and small power consumption are required, such as scanners, portable camcorders, and digital still cameras. An example will now be described with reference to the attached drawings.

Figure 7:
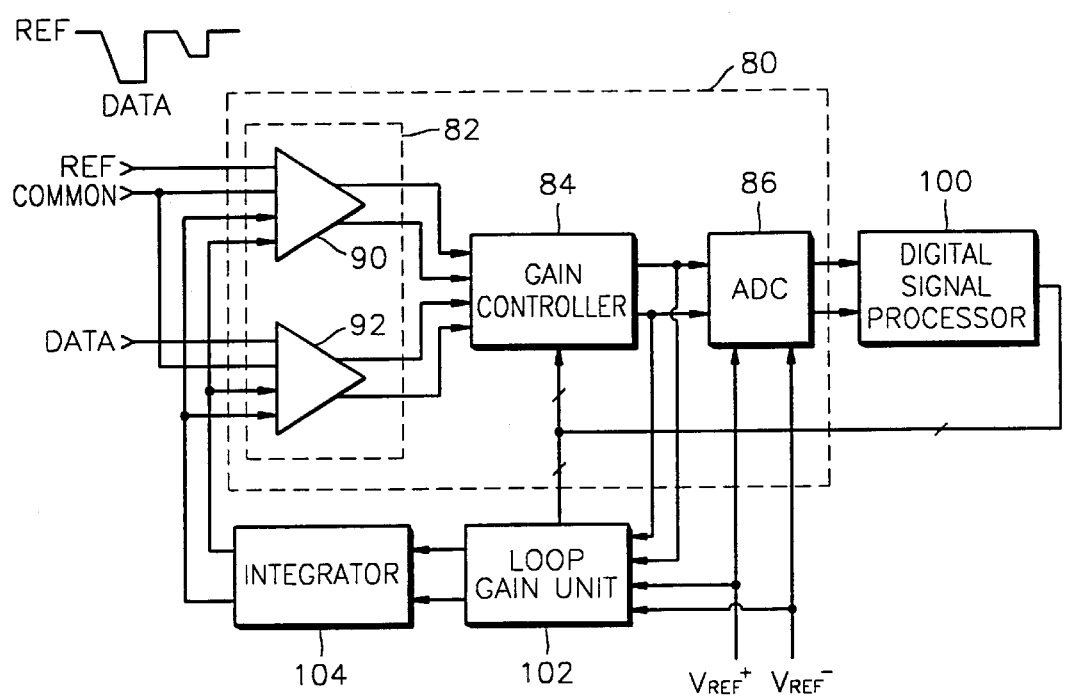
FIG. 7 is a schematic block diagram of an image processing system using the gain controller shown in FIG. 4.

FIG. 7 is a schematic block diagram of an image processing system using the gain controller shown in FIG. 4. Referring to FIG. 7, the image processing system includes a charge coupled interface system 80 a digital signal processor 100, a loop gain unit 102, and an integrator 104.

The charge coupled interface system 80 shown in FIG. 7 includes a correlated double sampler (CDS) 82 made of two sample and hold units 90 and 92, a gain controller 84 corresponding to the gain controller shown in FIG. 4, and an analog-to-digital converter 86.

Referring to FIG. 7, a charge coupled device (CCD) (not shown) photographs an image. A video signal generated by the CCD (not shown), that is, a CCD video signal including a reference level REF and a data level DATA, is output to the CDS 82. The CDS 82 samples and holds the CCD video signal from the CCD (not shown) on the basis of a common level COMMON, thus removing noise. The result of sampling and holding is output to the gain controller 84. The analog-to-digital converter 86 receives a result where the gain is controlled from the CDS 82, converts the received result into a digital signal, and outputs the converted digital signal.

When the level of a signal input to the CCD (not shown) suddenly increases or decreases due to variations in brightness of an image input from the outside, the signal deviates from the input range of the analog-to-digital converter 86 or concentrates on very low codes. When the converted digital code is reproduced to an image in such a state, the image is too bright or too dark. Therefore, it is difficult to recognize the image.

Therefore, the digital signal processor 100 analyzes and processes the level of the digital signal output from the analog-to-digital converter 86. The result analyzed and processed by the digital signal processor 100 is the digital gain control signal, which is output to the gain controller 84 and the loop gain unit 102. The gain controller 84, which can be realized by the circuit shown in FIG. 4, controls the gain of the result of sampling and holding, which is differentially received from the CDS 82 in response to the digital gain control signal. Therefore, the magnitude of the signal output from the analog-to-digital converter 86 can be increased or reduced to an appropriate level. Here, the plurality of gain controllers 84 can be serially connected between the CDS 82 and the analog-to-digital converter 86 unlike in FIG. 7. Accordingly, it is possible to obtain a desired gain.

The image processing system shown in FIG. 7 can operate in two modes. A first mode is a black-level correction period coinciding with the level of the CCD video signal generated from real black light with the lowest input level of the analog-to-digital converter 86. In the case of a typical digital camcorder, the black-level correction period is repeated every 2 $\mu$s during a period which repeats every 64 $\mu$s. During this period, the CCD outputs the level generated by the black light, which is a signal from a pixel covered with a metal, to the CDS 82. At this time, a negative feedback signal which passes through the loop gain unit 102 and the integrator 104 begins to be processed. In order to make the black-level coincide with the lowest reference voltage Vref−Vref$^+$ of the analog-to-digital converter 86, the loop gain unit 102 compares the output of the gain controller 84 with the lowest reference voltage used by the analog-to-digital converter 86. Therefore, the loop gain unit 102 attenuates or amplifies the difference generated by the comparison result and outputs the attenuated or amplified difference to the integrator 104. The integrator 104 continuously accumulates the signal received from the loop gain unit 102 and outputs the accumulated output to the CDS 82. The CDS 82 subtracts the output of the integrator 104 from the input signals REF and DATA and transmits the subtraction result to the gain controller 84. The output of the gain controller 84 generated by the input of the black-level signal is converged to and fixed to the lowest reference voltage of the analog-to-digital converter 86, due to the negative feedback operation.

In a second mode, the loop gain unit 102 on a negative feedback signal path during a period where the video signal is processed does not operate and the integrator 104 continuously supplies the output determined during the black-level correction period to the CDS 82. After the black-level is fixed, when a general video signal is processed, picture information which passed only through the CDS 82 and the gain controller 84 is output to the analog-to-digital converter 86.

As mentioned above, it is possible to automatically control the gain of the input signal at high operating speed and to reduce power consumption since the time required for settling the gain of the input signal to a desired value by the gain controller using the switched capacitor according to the present invention is short. Also, according to the gain controller of the present invention, it is possible to control the gain of the input signal to have more values than in the conventional gain controller, using a limited number of capacitors. The gain controller according to the present invention can be realized by a chip having a smaller size since less sampling capacitance is required for obtaining the desired gain than in the conventional gain controller.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A gain controller for controlling gain of an analog input signal, said gain controller being operable in a sampling operational mode and an amplifying operational mode, comprising:

an operational amplifier for controlling the gain of the analog input signal and generating an output signal having the controlled gain, the operational amplifier being operable in a switching mode and having an output which includes first and second output terminals, an output terminal switch being operable to connect the first and second output terminals together when the operational amplifier is in the switching mode;

input capacitors connected in parallel to the input side of the operational amplifier;

a feedback capacitor connected between the input side and the output side of the operational amplifier;

a plurality of switches for selectively connecting at least one of the input capacitors to at least one of the input signal and a reference voltage, in response to the operational mode and an externally applied predetermined digital gain control signal;

an input which differentially inputs an output of a correlated double sampler (CDS), the CDS sampling and holding a photographed image and providing the sampled and held image as the output of the CDS;

gain controlling circuitry which controls the gain of the output of the CDS in response to a digital gain control signal, the digital gain control signal being provided by a digital signal processor in response to a digital signal; and an output which provides a gain-controlled output signal to an analog-to-digital converter which converts the gain-controlled/output signal into the digital signal.

2. The gain controller of claim 1, wherein each of the switches comprises at least one transistor.

3. The gain controller of claim 1, wherein the gain of the operational amplifier is expressed as a ratio of an input capacitance to the capacitance of the feedback capacitor, the input capacitance being the sum of the capacitances of the input capacitors that are connected to the input signal.

4. The gain controller of claim 1, wherein the digital gain control signal is generated so that the desired input capacitance is determined by the combination of the capacitances of corresponding capacitors among the input capacitors.

* * * * *